United States Patent
Gerstmeier et al.

(10) Patent No.: US 7,035,753 B2
(45) Date of Patent: Apr. 25, 2006

(54) METHOD AND APPARATUS FOR PLACING AN INTEGRATED CIRCUIT INTO A DEFAULT MODE OF OPERATION

(75) Inventors: Guenter Gerstmeier, Chapel Hill, NC (US); Georg Antonischki, Durham, NC (US); Shane Sanders, Apex, NC (US); Marco Ziegelmaier, Durham, NC (US)

(73) Assignee: Infineon Technologies AG, Munich (DE)

( * ) Notice: Subject to any disclaimer, the term of this patent is extended or adjusted under 35 U.S.C. 154(b) by 504 days.

(21) Appl. No.: 10/102,145

(22) Filed: Mar. 20, 2002

(65) Prior Publication Data

US 2003/0179010 A1 Sep. 25, 2003

(51) Int. Cl.
*G06F 19/00* (2006.01)
*G06F 11/00* (2006.01)

(52) U.S. Cl. .......................... 702/120; 714/30
(58) Field of Classification Search ................ 702/117, 702/119, 120; 714/30, 724; 326/8, 9, 14, 326/16; 716/4
See application file for complete search history.

(56) References Cited

U.S. PATENT DOCUMENTS

| | | | | |
|---|---|---|---|---|
| 5,410,654 A | * | 4/1995 | Foster et al. | 711/147 |
| 5,483,638 A | * | 1/1996 | Katsuta | 714/30 |
| 5,530,804 A | * | 6/1996 | Edgington et al. | 714/30 |
| 5,557,558 A | * | 9/1996 | Daito | 702/120 |
| 5,926,159 A | * | 7/1999 | Matsuzaki et al. | 345/97 |
| 2003/0145250 A1 | * | 7/2003 | Chin | 714/30 |

* cited by examiner

*Primary Examiner*—Marc S. Hoff
*Assistant Examiner*—Paul Kim
(74) *Attorney, Agent, or Firm*—Patterson & Sheridan, L.L.P.

(57) ABSTRACT

An integrated circuit having a signal bus carrying address signals includes mode selection means. The mode selection means has a default state and a non-default state. The integrated circuit is placed into a default and generic mode of operation when the mode selection means is in the default state. An address signal applied to the integrated circuit is interpreted as a specific mode of operation when the integrated circuit is in the default and generic mode of operation. The mode selection means when in the non-default state precludes placement of the integrated circuit into the default and generic mode of operation.

29 Claims, 2 Drawing Sheets

METHOD AND APPARATUS FOR PLACING AN INTEGRATED CIRCUIT INTO A DEFAULT MODE OF OPERATION

FIELD OF THE INVENTION

The present invention relates generally to integrated circuits and, more particularly, to integrated circuits that are placed into different modes of operation.

BACKGROUND OF THE INVENTION

Integrated circuits (ICs) are often very complex devices from both a structural and functional standpoint. The testing of such structurally and functionally complex devices is often equally complex. In order to ensure the IC is functioning properly, manufacturers test the devices on sophisticated testing machines. Some ICs are placed into a test mode of operation in order to be properly and expediently tested. These ICs are operated in their final or end use in a normal or non-test mode of operation. Thus, the IC must be placed into a desired one of at least two different operational modes.

Typically, an IC is placed into a desired mode of operation through the application of a predetermined sequence of several mode selection signals to the input pins of the IC. In order for mode selection or other input signals to be received and decoded by the IC, the IC must be powered up and ready to accept input signals. This requires the IC to complete its power on or start-up process, which typically includes turning on voltage pumps, initializing chip logic, etc. The predetermined sequence of mode selection signals sent to the IC to invoke the desired mode of operation generally includes signals that set the operational mode register of the IC and thereby cause the IC to enter a desired "generic" operational mode. Further mode selection signals, referred to as mode entry keys, are provided to select a specific test or operational mode within the generic mode of operation.

The first mode selection signal is compared against a predetermined code. If the mode selection signal matches the predetermined code, the next signal is received as a mode entry key and decoded as such to thereby place the IC into a specific mode of operation that corresponds to the particular mode entry key. The mode selection signal, in essence, verifies that the signal to follow will be a mode entry key and will therefore correspond to a specific mode of operation. Thus, in order to place a conventional IC into a specific mode of operation, at least two separate mode selection signals, i.e., a mode selection signal and a mode entry key, must be issued and decoded.

The above-described signals are typically applied by a piece of equipment, such as, for example, a test machine or test station, which must be configured to apply the appropriate signals in the proper sequence that are required to place the particular IC into the desired operational mode. If, for example, the manufacturer desires to test a different IC on the same piece of test equipment that piece of test equipment must be reconfigured to apply the specific signals in the proper sequence to place that particular IC in the desired mode of operation. The required set up of the machine and the application of the signals to the IC consumes valuable time.

The first time, or first few times, an IC is powered up and operated is likely to be for the purpose of testing. However, each IC must nonetheless be individually placed into the desired mode of operation through the time-consuming and laborious process described above. Once the initial testing of the IC has been completed, subsequent entry into the test mode of operation is typically not necessary and may be undesirable.

Therefore, what is needed in the art is a method and apparatus that places an IC into a desired mode of operation in a reduced amount of time.

Furthermore, what is needed in the art is a method and apparatus that places an IC into a desired mode of operation without requiring the application of a plurality of input signals to the IC.

Moreover, what is needed in the art is a method and apparatus that places an IC into a default mode of operation and which can be reset to automatically enter a non-default mode of operation to thereby prevent inadvertent entry of the IC into the default mode of operation.

SUMMARY OF THE INVENTION

The present invention provides an integrated circuit having a default and generic mode of operation from which a specific mode of operation is entered in response to the application of a single address signal.

The invention comprises, in one form thereof, an integrated circuit including mode selection means having a default state and a non-default state. The integrated circuit is placed into a default and generic mode of operation when the mode selection means is in the default state. An address signal applied to the integrated circuit is interpreted as a specific mode of operation when the integrated circuit is in the default and generic mode of operation. The mode selection means when in the non-default state precludes placement of the integrated circuit into the default and generic mode of operation.

An advantage of the present invention is that the integrated circuit is placed in a default and generic mode of operation that enables entry into a specific mode of operation without requiring the application of a plurality of input/address signals.

Another advantage of the present invention is that the integrated circuit is placed into a desired specific mode of operation in a reduced amount of time.

Yet another advantage of the present invention is that the integrated circuit is automatically placed into a default mode of operation, and can be reset to automatically enter a non-default mode of operation to thereby prevent subsequent entry of the integrated circuit into the default mode of operation.

BRIEF DESCRIPTION OF THE DRAWINGS

The above-mentioned and other features and advantages of this invention, and the manner of attaining them, will become appreciated and be more readily understood by reference to the following detailed description of one embodiment of the invention in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE DRAWINGS

Figure 1:
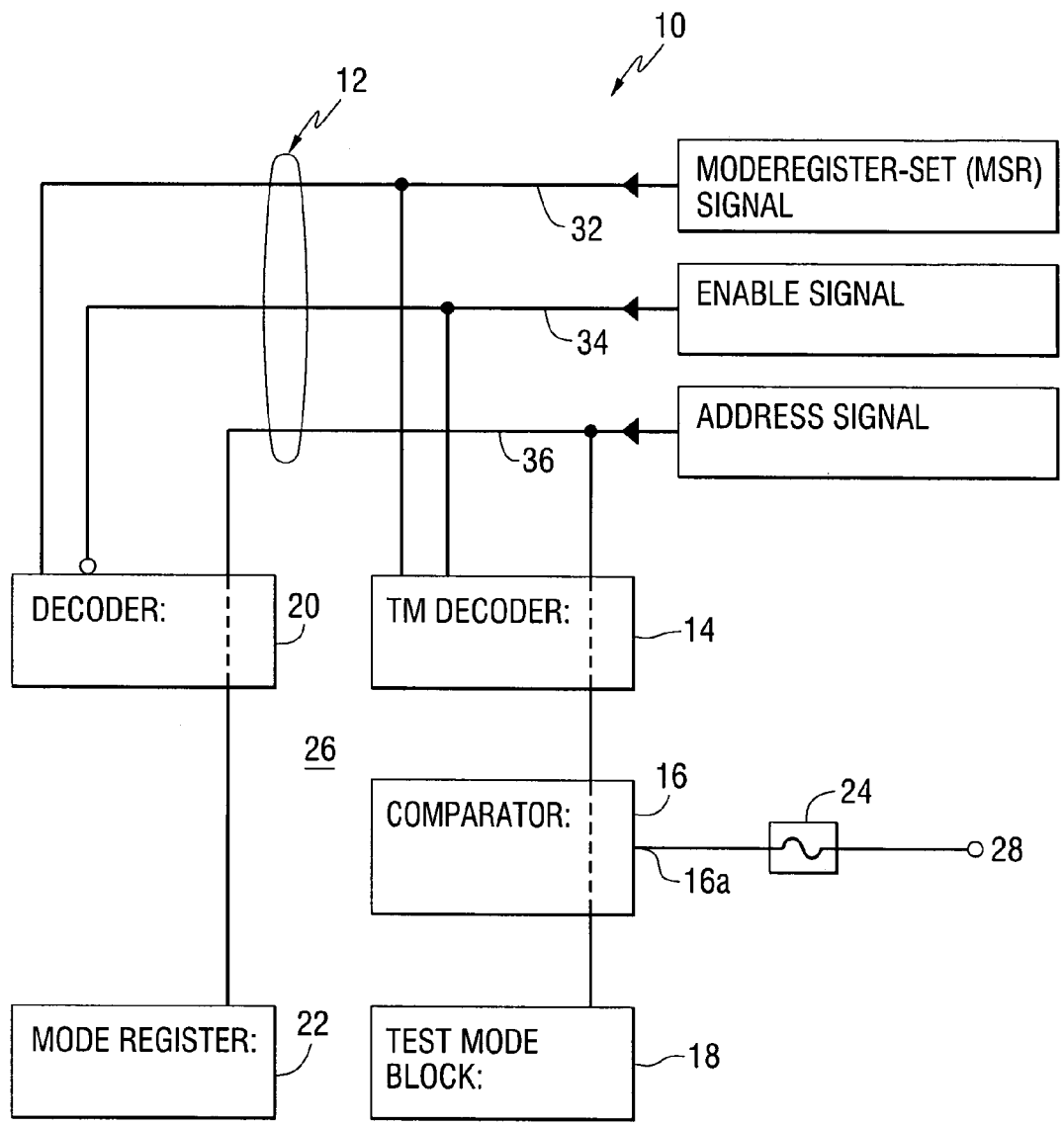
FIG. 1 is a block diagram of one embodiment of an integrated circuit of the present invention.

Referring now to FIG. 1, one embodiment of an integrated circuit of the present invention is shown. Integrated circuit (IC) 10 includes signal or control bus 12, test mode decoder 14, comparator 16, test mode block 18, mode decoder 20, mode register 22, and mode selection device 24. Integrated circuit 10 is formed on substrate 26, and is connected to at least one supply voltage 28.

Generally, and as will be more particularly described hereinafter, mode selection device 24 is manufactured in a default state or condition which, in turn, automatically places IC 10 in a default and generic mode of operation, such as, for example, a generic test mode. With IC 10 thus placed into the default and generic mode of operation, a single address signal places IC 10 into a specific mode of operation, such as, for example, a specific test mode. IC 10, when mode selection device 24 is removed from the default state and placed into a non-default state, requires at least one mode entry signal to enter a generic (non-default) mode of operation, such as, for example, a generic use mode. Further, at least one mode entry key signal must be applied to place IC 10 into a specific mode of operation, such as, for example, a specific use mode. However, with mode selection device 24 placed in the non-default state, entry of IC 10 into the default and generic mode of operation is disabled.

Control bus 12 carries various signals for distribution to the various functional blocks and circuitry of IC 10. More particularly, control bus 12 carries mode register set (MRS) signal 32, enable signal 34, and address signal 36. MRS signal 32 is received by, and an active MRS signal 32 enables, test mode decoder 14 and mode decoder 20. Enable signal 34 is received by test mode decoder 14 and mode decoder 20. An active enable signal 34 enables test mode decoder 14, whereas an inactive enable signal 34 enables mode decoder 20. Address signal 36 contains data, such as, for example, data that corresponds to a generic mode of operation, a specific mode of operation, or other commands and information for the various other functional blocks (not shown) of IC 10.

Test mode decoder 14 is electrically connected to control bus 12 and receives MRS signal 32, enable signal 34 and address signal 36 therefrom. Test mode decoder 14 is also electrically connected to comparator 16. Test mode decoder 14, when enabled by MRS signal 32 and enable signal 34, passes address signal 36 to comparator 16. If not enabled by MRS signal 32 and enable signal 34, test mode decoder 14 blocks address signal 36 from being received by comparator 16.

Comparator 16 receives address signal 36 from test mode decoder 14 when test mode decoder 14 is enabled by MRS signal 32 and enable signal 34. Mode input 16a of comparator 16 is electrically connected to mode selection device 24. Comparator 16 passes address signal 36 to test mode block 18 dependent upon the logic level of mode input 16a. Mode input 16a is, in turn, dependent at least in part upon the state or condition of mode selection device 24 as will be more particularly described hereinafter. Thus, test mode block 18 receives address signal 36 only when test mode decoder 14 is enabled as described above and when mode selection device 24 is in the appropriate state.

Test mode block 18, such as, for example, a conventional address decoder, receives address signal 36 from comparator 16 when comparator 16 is enabled by mode selection device 24. Test mode block 18, as is known in the art, decodes or interprets address signal 36 to select and place IC 10 in a specific mode of operation, such as, for example, a specific test mode, corresponding to or indicated by address signal 36.

Mode decoder 20, such as, for example, a conventional address decoder, is electrically connected to control bus 12 and receives MRS signal 32, enable signal 34 and address signal 36 therefrom. Mode decoder 20 is also electrically connected to mode register 22. Mode decoder 20, when enabled by MRS signal 32 and enable signal 34, passes address signal 36 to mode register 22.

Mode register 22, such as, for example, a conventional address decoder, receives address signal 36 from mode decoder 20 when decoder 20 is enabled as described above. Mode register 22 decodes or interprets address signal 36 to select and place IC 10 in a generic or general mode of operation, such as, for example, a general test or non-test operational mode.

Mode selection device 24, such as, for example, a laser fuse or electronic fuse, is interconnected between supply voltage 28 and mode input 16a of comparator 16. Mode selection device 24 in a default state or condition electrically connects mode input 16a of comparator 16 to a default voltage or logic level, such as supply voltage 28. In a non-default state or condition, mode selection device 24 connects mode input 16a to non-default voltage or logic level, such as, for example, ground potential. Dependent at least in part upon the logic level of mode input 16a, comparator 16 passes or blocks address signal 36 from test mode block 18. Those skilled in the art will recognize that a current-limiting resistor (not shown) may be placed between mode input 16a and ground. Mode selection device 24 is, for example, formed integrally with substrate 26. However, it is to be understood that mode selection device 24 can be alternately configured, such as, for example, as a discrete device commonly packaged with or as an input to IC 10.

In use, IC 10 is configured to power-up in a default and generic mode of operation, and to be placed into a specific mode of operation in response to the application of a single input signal. More particularly, mode selection device 24 is manufactured or set in a predetermined state or condition to thereby place a corresponding default logic level at mode input 16a of comparator 16. With MRS signal 32 and enable signal 34 enabling test mode decoder 14 to pass address signal 36 to comparator 16, the logic level at mode input 16a determines whether comparator 16 passes or blocks address signal 36 to/from test mode block 18. With mode input 16a at the default logic level, such as, for example, a high logic level, comparator 16 is configured to pass address signal 36 to test mode block 18. Test mode block 18, in turn, decodes or interprets address signal 36 as indicating a specific operational mode, and places IC 10 in a specific mode of operation, such as, for example, a specific test mode, that corresponds to or is indicated by the data contained within address signal 36.

Conversely, with mode selection device 24 removed from the default state and placed into a non-default state, and with MRS signal 32 and enable signal 34 remaining enabled, test mode decoder 14 remains enabled to pass address signal 36 to comparator 16. However, due to mode selection device 24 being in the non-default state, mode input 16a of comparator 16 is now at a non-default logic level. Thus, comparator 16 is configured to block address signal 36 from test mode block 18. Address signal 36 is rejected, i.e., is not passed onto or decoded by either of test mode block 18 or mode register 22, and therefore is precluded from being interpreted as a specific operational mode.

Alternatively, with MRS signal 32 active and enable signal 34 inactive address signal 36 is received and interpreted by mode register 22 to thereby place IC 10 into a generic (but not default) mode of operation. Further alternatively, with MRS signal 32 inactive test mode decoder 14 and mode decoder 22 are disabled, and address signal 36 is interpreted by various other functional circuits (not shown) of IC 10 to perform other functions.

As will be understood by those skilled in the art, placing IC 10 in a generic or general mode of operation initializes various circuitry, such as, for example, logic gates and registers, in preparation for receiving and appropriately interpreting subsequent commands, such as, for example, specific mode selection or mode entry key signals. In contrast, placing IC 10 in a specific mode of operation, such as a specific test mode or use mode, commences the operation of that particular test mode. Mode selection device 24 places a default logic voltage level at mode input 16a of comparator 16 to thereby place IC 10 into a generic default operational mode. With IC 10 in the generic default operating mode, the application of a single address signal 36 places IC 10 directly into a specific operational mode upon. The application of one or more mode selection signals is not required in order to place IC 10 into a generic operational mode. Nor is the application of more than one mode entry key signal required in order to place IC 10 into a specific operational mode. Thus, IC 10 is placed into a desired and specific mode of operation with the application of a single address signal 36. The amount of time required to set-up or program a piece of test equipment to issue the proper sequence of signals to place IC 10 into a desired mode of operation is thereby reduced. Further, the amount of time required for a piece of test equipment to place IC 10 into a desired mode of operation is also reduced, thereby saving costly test time.

Figure 2:
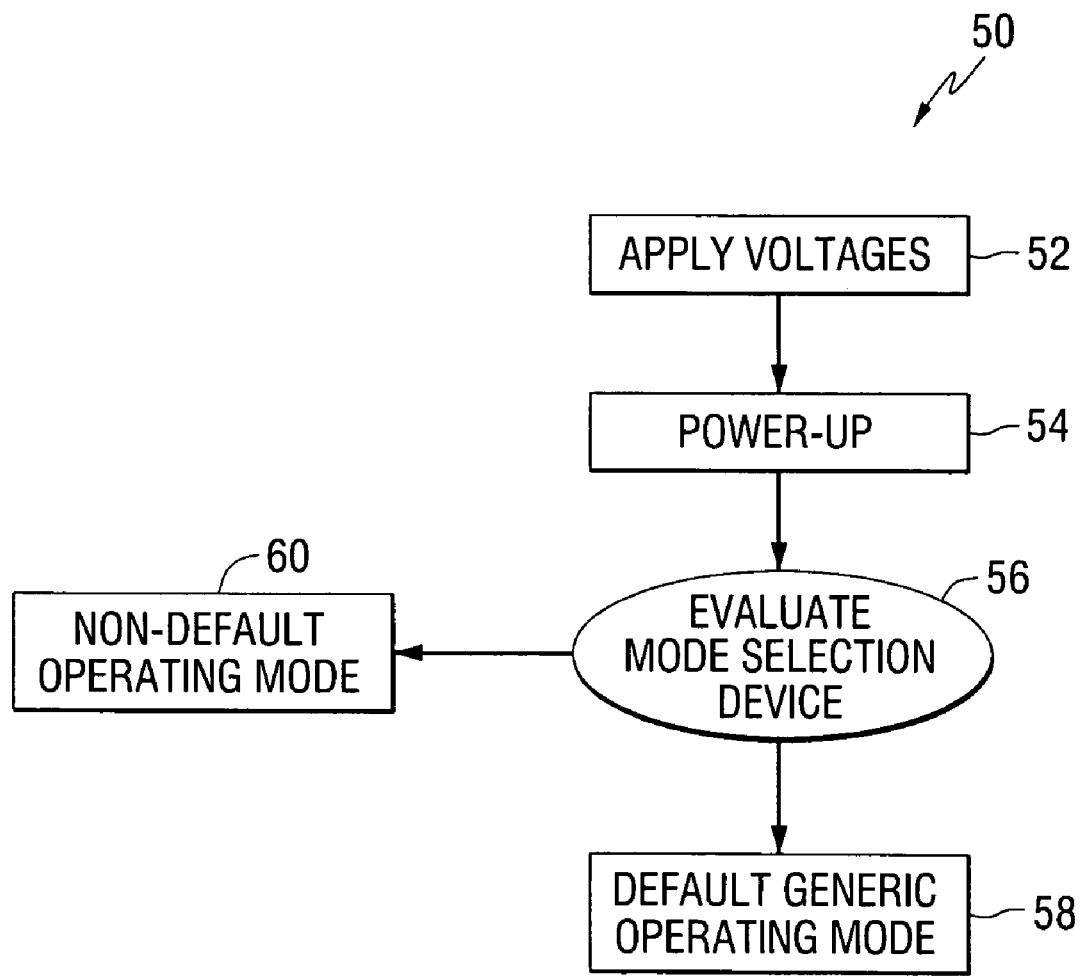
FIG. 2 is a flow chart of one embodiment of the method of default test mode entry of the present invention is shown.

Referring now to FIG. 2, a flow chart of one embodiment of a method of placing an integrated circuit into a default mode of operation is shown. Method 50 includes the steps of applying voltages 52, power-up sequence 54, evaluate mode selection device 56, enter default generic operating mode 58, and enter non-default operating mode 60.

Applying voltages step 52 includes the application of the at least one supply voltage 28, such as, for example, $V_{DD}$, $V_{SS}$, $V_{REF}$, ground voltages, etc., required for IC 10 to operate. Power-up sequence 54 includes the initialization of the internal circuitry of IC 10, such as, for example, mode decoder 20, mode register 22, logic circuitry and voltage pumps (not shown), etc., of IC. Exactly what is performed in each of applying voltages step 52 and power-up sequence 54 will vary depending on the particular configuration of the particular IC.

Evaluate mode selection device step 56 determines whether the integrated circuit enters a default generic mode of operation or a non-default mode of operation. More particularly, evaluate step 56 includes checking the state or condition of mode selection device 24. Depending upon the outcome of evaluate step 56, IC 10 enters either the default generic mode of operation or waits for one or more address signals 36 to place IC 10 into a non-default mode of operation. If evaluate step 56 determines that the mode selection device 24 indicates that IC 10 is to be operated in the default generic mode of operation, method 50 proceeds to execute the step of entering default generic operating mode 58.

The step of entering default generic operating mode 58 prepares IC 10 to enter a specific mode of operation, such as, for example, a specific test mode, upon the receipt of a single address signal 36. The default specific mode of operation contained within the single address signal 36 is decoded by test mode block 18. Thus, only one address signal 36 containing a single test mode entry key need be issued to IC 10 in order for IC 10 to enter a specific mode of operation from the default generic operating mode.

The step of entering non-default operating mode 60 places IC 10 into one of a plurality of other, i.e., non-default, operating modes, such as, for example, a generic use mode of operation. Further address signals 36 containing additional data, such as, for example, mode selection signals and/or mode entry keys, are required in order to place IC 10 into a specific operational mode.

As described above, mode selection device 24 is manufactured in a default state or condition wherein a default logic level is placed upon mode input 16a of comparator 16. The default logic level at mode input 16a of comparator 16 places IC 10 into a default generic operational mode. With IC 10 in the default generic operating mode, the application to IC 10 of a single address signal 36 places IC 10 into a specific operating mode within the default generic operating mode. Thus, IC 10 is placed into one of a plurality of specific modes of operation, such as, for example, a test mode, through the application of a single address signal 36 to IC 10. In essence, mode selection device 24 in the default state switches on the default generic mode of operation, and in the non-default state precludes placing IC 10 into the generic mode of operation.

In the embodiment shown, mode selection device 24 when in a default position places mode input 16a at a default logic level to thereby enable comparator 16 to pass address signal 36 to test mode block 18. However, it is to be understood that the present invention can be alternately configured, such as, for example, to block address signal 36 from being passed to test mode block 18 when mode selection device 24 and the logic level at mode input 16a are at the default state and logic level, respectively.

In the embodiment shown, mode selection device 24 when placed in the non-default state precludes the entry of IC 10 into the default and generic mode of operation is disabled. However, it is to be understood that the present invention can be alternately configured to enable IC 10 to be placed into a generic test and/or a specific test mode of operation regardless of the condition (i.e., default or non-default) of mode selection device 24. Such a configuration enables the testing of the integrated circuit subsequent to the placing of mode selection device 24 into the non-default state.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed is:

1. An integrated circuit, said integrated circuit having a signal bus, said signal bus carrying address signals, said integrated circuit comprising:
   mode selection means, said mode selection means having a default state and a non-default state, said mode selection means when in said default state placing said integrated circuit into a default and generic mode of operation, wherein in the default mode of operation a single address signal applied to said integrated circuit is interpreted as a mode selection signal, the mode selection signal causing the integrated circuit to operate in a specific mode of operation, said mode selection means when in said non-default state precluding placement of said integrated circuit into said default and generic mode of operation.

2. The integrated circuit of claim 1, wherein said generic and default mode of operation comprises a generic test mode of operation.

3. The integrated circuit of claim 1, wherein said specific mode of operation comprises a specific test mode.

4. The integrated circuit of claim 1, wherein said mode selection means comprises:
 a comparator receiving the address signal, said comparator having a mode input, said comparator passing the address signal to a mode block when said mode input is at a default logic level and blocking the address signal from the mode block when said mode input is at a non-default logic level, the mode block interpreting the address signal as and placing said integrated circuit into a specific mode of operation; and
 a mode selection device, said mode selection device in said default state connecting said mode input to the default logic level, said mode selection device in said non-default state connecting said mode input to the non-default logic level.

5. The integrated circuit of claim 4, wherein said mode selection device comprises one of a laser fuse and an electronic fuse.

6. The integrated circuit of claim 4, wherein said mode selection device electrically connects said mode input to a high logic voltage level in said default state, and connects said mode input to a ground potential when in said non-default state.

7. The integrated circuit of claim 6, wherein said high logic voltage level comprises a supply voltage of said integrated circuit.

8. An integrated circuit formed on a substrate, said integrated circuit having a address bus carrying address signals, said integrated circuit comprising:
 a test mode decoder electrically interconnected with and receiving an address signal from said address bus, said test mode decoder receiving and being enabled by an enable signal to pass on said address signal;
 a comparator electrically interconnected with and receiving the address signal from said test mode decoder when said test mode decoder is enabled, said comparator having a mode input, said comparator passing on said address signal when said mode input is at a default logic level and blocking said address signal when said mode input is at a non-default logic level;
 a mode selection device electrically interconnected with said mode input, said mode selection device having a default and non-default state, said mode selection device connecting said mode input to said default logic level when in said default state, and connecting said mode input to said non-default logic level when in said non-default state; and
 a test mode block electrically interconnected with said comparator, said test mode block receiving said address signal from said comparator when said mode input is at said default logic state, said address signal being blocked from said test mode block by said comparator when said mode input is at said non-default logic level, said test mode block interpreting said address signal as a mode selection signal when the mode input is at the non-default logic level, wherein the mode selection signal selects a specific mode of operation to thereby place said IC into the specific mode of operation when the mode input is at the non-default logic level.

9. The integrated circuit of claim 8, wherein said mode selection device is electrically connected between said mode input and a supply voltage of said integrated circuit, said mode selection device when in said default state electrically connecting said mode input to said supply voltage to thereby place a logic high voltage level at said mode input, said mode selection device when in said non-default state electrically connecting said mode input to ground potential to thereby place a logic low voltage level at said mode input.

10. The integrated circuit of claim 9, wherein said mode selection device comprises one of a laser fuse and an electronic fuse.

11. The integrated circuit of claim 10, wherein said mode selection device is substantially a short-circuit when in said default state and substantially an open-circuit when in said non-default state.

12. A method of placing an integrated circuit into a default mode of operation, said method comprising:
 determining the state of a mode-indicating device having a default state and a non-default state;
 entering the default mode of operation when the mode-indicating device is in the default state, wherein in the default state, an address signal applied to the integrated circuit is interpreted as a mode selection signal, wherein the mode selection signal selects a specific mode of operation; and
 not entering the default mode of operation when the mode-indicating device is in the non-default state.

13. The method of claim 12, wherein said entering step comprises enabling a comparator to pass the address signal directly to a decoding block that interprets the address signal as the specific mode of operation.

14. The method of claim 13, wherein the mode-indicating device is electrically connected to an input of the comparator, the mode-indicating device when in the default state placing a default logic level at the input to thereby place the integrated circuit into the default mode of operation.

15. The method of claim 14, wherein said not entering step comprises blocking the address signal from being passed directly through the comparator.

16. The method of claim 15, wherein the mode-indicating device when in the non-default state places a non-default logic level at the input, the address signal being blocked by the comparator from passing directly to a test mode block when the input is at the non-default logic level.

17. The method of claim 12, wherein the default mode of operation comprises a generic test mode of operation.

18. The method of claim 12, wherein said mode-indicating device comprises one of a laser fuse and an electronic fuse.

19. The method of claim 12, wherein said determining step comprises connecting a logic level at an input of a comparator, the comparator being responsive to the logic level at the input to either pass or block the address signal from being decoded by a test mode block as the specific mode of operation.

20. A method of placing an integrated circuit into a specific test mode of operation, said method comprising:
 setting the state of a mode-indicating device;
 entering a generic test mode of operation when the mode-indicating device is in a default state;
 interpreting an address signal as a mode selection signal when the integrated circuit is in the generic test mode of operation, wherein the mode selection signal selects a specific test mode of operation when the integrated circuit is in the generic test mode of operation; and precluding subsequent entry into the generic test mode of operation by resetting the mode-indicating device to a non-default state.

21. The method of claim 20, comprising the further step of not entering the generic test mode of operation when the mode-indicating device is in the non-default state.

22. The method of claim 20, wherein the specific mode of operation comprises a specific test mode.

23. The method of claim 20, wherein said entering step comprises enabling a comparator to pass the address signal directly to a test mode block, the test mode block performing said interpreting step.

24. An integrated circuit having a signal bus line, said signal bus line carrying address signals, said integrated circuit comprising:

a mode selection means having a default and non-default state, said mode selection means when in said default state placing said integrated circuit into a default and generic mode of operation, said mode selection means when in said non-default state precluding placement of said integrated circuit into said default and generic mode of operation; and a test mode block interpreting an address signal as a mode selection signal when the mode selection means is in the default state, wherein the mode selection signal selects a specific mode of operation, and placing said integrated circuit into the specific mode of operation when said mode selection means is in said default state.

25. The integrated circuit of claim 24, further comprising a comparator receiving the address signal, said comparator passing the address signal to said test mode block when said mode selection means is in said default state, said comparator blocking the address signal from said test mode block when said mode selection means is in said non-default state.

26. The integrated circuit of claim 24, wherein said mode selection means comprises a mode selection device having a default and non-default condition, said mode selection device when in said default condition placing said mode selection means in its default state, said mode selection device when in said non-default condition placing said mode selection means in its non-default state.

27. A method of placing an integrated circuit into a default mode of operation, said method comprising:

determining the state of a mode-indicating device;

entering the default mode of operation when the mode-indicating device is in a default state; and not entering the default mode of operation when the mode-indicating device is in a non-default state;

wherein said entering step comprises enabling a comparator to pass the address signal directly to a decoding block that interprets the address signal as a mode selection signal, wherein the mode selection signal selects a specific mode of operation when the mode-indicating device is in the default state.

28. A method of placing an integrated circuit into a default mode of operation, said method comprising:

determining the state of a mode-indicating device;

entering the default mode of operation when the mode-indicating device is in a default state; and not entering the default mode of operation when the mode-indicating device is in a non-default state;

wherein said determining step comprises connecting a logic level at an input of a comparator, the comparator being responsive to the logic level at the input to either pass or block an address signal from being decoded by a test mode block as a mode selection signal, wherein the mode selection signal selects a specific operational mode when the mode-indicating device is in a default state.

29. A method of placing an integrated circuit into a specific test mode of operation, said method comprising:

setting the state of a mode-indicating device;

entering a generic test mode of operation when the mode-indicating device is in a default state; and interpreting an address signal as a mode selection signal when the integrated circuit is in the generic test mode of operation, where in the mode selection signal selects a specific test mode of operation when the integrated circuit is in the generic test mode of operation;

wherein said entering step comprises enabling a comparator to pass an address signal directly to a test mode block, the test mode block performing said interpreting step.

* * * * *